US00RE36973E

United States Patent [19]

Shigemori

[11] E Patent Number: Re. 36,973

[45] Reissued Date of Patent: Nov. 28, 2000

[54] DIGITALLY-CORRECTED TEMPERATURE-COMPENSATED CRYSTAL OSCILLATOR HAVING A CORRECTION-SUSPEND CONTROL FOR COMMUNICATIONS SERVICE

[75] Inventor: Mikio Shigemori, Suwa, Japan

[73] Assignee: Seiko Epson Corporation, Tokyo, Japan

[21] Appl. No.: 08/837,217

[22] Filed: Apr. 22, 1997

Related U.S. Patent Documents

Reissue of:

[64] Patent No.: 5,204,975
Issued: Apr. 20, 1993
Appl. No.: 07/596,172
Filed: Oct. 10, 1990

U.S. Applications:

[63] Continuation of application No. 08/425,489, Apr. 20, 1995, abandoned.

[30] Foreign Application Priority Data

Oct. 12, 1989 [JP] Japan ..... 1-265682
Jan. 24, 1990 [JP] Japan ..... 2-14116

[51] Int. Cl.[7] ..... H04B 1/10

[52] U.S. Cl. ..... 455/231; 455/256; 455/257; 455/310

[58] Field of Search ..... 455/254, 256, 455/260, 231, 242, 182, 263, 196.1, 63, 67.3, 296, 310, 343, 257; 331/65–66, 175, 176, 177 R, 179

[56] References Cited

U.S. PATENT DOCUMENTS 4,504,973 3/1985 April .
5,008,955 4/1991 Sato ..... 455/310
5,025,251 6/1991 Mittel et al. ..... 455/343

FOREIGN PATENT DOCUMENTS

54-A-149403 11/1979 Japan .
57-132444 8/1982 Japan .
57-210743 12/1982 Japan .
60-149223 8/1985 Japan .
62-102609 5/1987 Japan .
A-62-101103 5/1987 Japan .
63-268325 11/1988 Japan .
63-A-290414 11/1988 Japan .
1-94735 4/1989 Japan .

OTHER PUBLICATIONS

English Abstract of JP–62–102609.

*Primary Examiner*—Nguyen Vo

[57] ABSTRACT

A radio transceiver having digitally-corrected temperature-compensated crystal oscillators (DTCXOs) including digital frequency temperature compensation circuits that are temporarily suspended from being updated, such that temperature compensation updates that can generate noise during periods of reception and transmission that could interfere with the audio channel and/or signal synchronization will be postponed. Temperature is converted to a digital signal that is then used to address a PROM. The PROM outputs a correction word appropriate for the temperature reading and inputs this to a latch. A timing control loads the latch after data has settled. The latched correction word is connected to a bank of switches and capacitors that trim the frequency of the crystal oscillator. During radio transmission and/or reception, the latch will be suspended from loading any new correction words. The last valid correction word, however, will remain.

24 Claims, 10 Drawing Sheets

RECEIVER SQUELCH
OFF
ON

SIGNAL 197

ADC 188 OUTPUT
ADDR
ADDR

PROM 186 OUTPUT
DATA
DATA

SIGNAL 193

SIGNAL 192

D1–Dn

XTAL 182
+
f0
–
198
199

RECEIVER SQUELCH
OFF
ON

OUTPUT ADC 88
ADDR
ADDR

OUTPUT PROM 86
DATA
DATA

LOAD SIGNAL 92

D1-Dn

XTAL 82
f0
+
-
200
201

TRANSMITTER
ACTIVE
STANDBY

ENCODER
ACTIVE
STANDBY

RECEIVER
ACTIVE
STANDBY

DECODER
ACTIVE
STANDBY

SIGNAL 166

OSCILLATOR 124
$f_0$

OSCILLATOR 132
$f_0$

SIGNAL 168

OSCILLATOR 154
$f_0$

DIGITALLY-CORRECTED TEMPERATURE-COMPENSATED CRYSTAL OSCILLATOR HAVING A CORRECTION-SUSPEND CONTROL FOR COMMUNICATIONS SERVICE

Matter enclosed in heavy brackets [ ] appears in the original patent but forms no part of this reissue specification; matter printed in italics indicates the additions made by reissue.

*This is a Continuation of application Ser. No. 08/425,489 filed Apr. 20, 1995 now abandoned, which in turn is a reissue of application Ser. No. 07/596,172, filed Oct. 10, 1990, U.S. Pat. No. 5,204,975.*

BACKGROUND OF THE INVENTION

The present invention relates generally to digitally-corrected temperature-compensated piezoelectric crystal oscillators (DTCXOs) having frequency outputs that are stable despite changes in the ambient temperature, and specifically to DTCXOs used in mobile communications service, such as in cellular phones and telephone call pagers.

Crystal oscillators tend to be the most stable of oscillators and so are frequently used in radio transmitters and receivers. The crystal oscillator derives its stability from the piezoelectric phenomenon exhibited by certain crystals. Cutting a piezoelectric crystal to a certain shape and size will determine its resonant frequency. The resonant frequency can be fine tuned by loading the crystal with a capacitance. Temperature changes will induce corresponding resonant frequency shifts in crystal oscillators. Since U.S. government regulations concerning radio transmitter carrier stability and accuracy are very demanding, thermal instability of crystal reference oscillators must be controlled. An early method of stabilizing crystal oscillators was to place the crystal in an "oven" that maintained a constant temperature. Because the temperature in the crystal oven did not vary, neither did the resonant frequency. Other methods have used varactor diodes to control frequency shifts by adjusting an analog voltage on the varactor according to ambient temperature. Crystals that have had their temperature-versus-resonant frequencies characterized can be corrected if the temperature is known. The technique also requires the load capacitance-to-resonant frequency shift to have been characterized. The prior are includes analog-to-digital conversion methods and the switching of a bank of load capacitors across a crystal.

FIG. 1 is typical example of a prior art cellular telephone transceiver, referred to by the general reference numeral 10, comprising an antenna 12, a transmit/receive (T/R) transfer switch 14, a bandpass filter 16, an RF amplifier 18, a first mixer 20, a receiver PLL synthesizer 22, a reference oscillator circuit 24, a first intermediate frequency (IF) bandpass filter 26, a first IF amplifier 28, a second mixer 30, a second local oscillator 32, a second IF bandpass 34, a second IF amplifier 36, a detector 38, a low-pass filter 40, a data/voice decoder 42 having a speaker 44 and an alphanumeric display 46, an alphanumeric keypad 48, a microphone 50, a frequency modulation (FM)/pulse modulation (PM) encoder 52, an encoder/decoder oscillator 54, a central processing unit (CPU) 56, a transmitter PLL synthesizer 58, a transmitter mixer 60, a transmitter amplifier 62, and a transmitter bandpass 64. An RF receiver is thus formed of elements 12–46, and a matching RF transmitter by elements 48–64, and also sharing 12–14. Receiver PLL synthesizer 22 provides a first local oscillator frequency for the first mixer 20 to beat with the incoming RF frequency to produce a first IF. Receiver PLL synthesizer 22 can be digitally programmed to output various frequencies, and therefore the frequencies received by transceiver 10 can be selectively tuned in. Reference oscillator 24 comprises a first DTCXO and supplies a master reference clock to PLL synthesizers 22 and 58. Because reference oscillator 24 provides the master reference for both transmit and receive, Federal Communications Commission (FCC) rules and good performance demand that the frequency be accurate and have minimal temperature drift. Second local oscillator 32 comprises a second DTCXO, and is similar to oscillator 24 (only the frequencies are different). Alternatively, a divider from reference oscillator 24 is used to provide the second local oscillator frequency (which will normally be a fixed frequency). Demodulator is provided by an FM discriminator, detector 38. The low-pass filter 40 allows only audio frequencies through to decoder 42. Decoder 42 will squelch speaker 44 until a proper calling code identification is received and recognized. Display 46 will keep a user informed of the status of transceiver 10. Voice input is picked up by microphone 50. Outgoing calling codes and operating modes are entered on keypad 48. If appropriate, encoder 52 will output to transmitter mixer 60 to beat with and modulate a transmit carrier frequency coming from PLL synthesizer 58. Just the desired products of transmitter mixer 60 are passed by transmitter bandpass 64. Transceiver 10 is capable of full duplex operation, so transmission will be simultaneous with reception, albeit at different frequencies. Encoder/decoder oscillator 54 supplies a common signal to encoder 52 and decoder 42, and is based on a third DTCXO similar to the first two. CPU 56 controls decoder 42, encoder 52 and the transmit and receive frequencies by virtue of its connects to PLL synthesizers 22 and 58.

Although FIG. 2 diagrams oscillator 24, it is also representative of the construction of oscillators 32 and 54. Oscillator 24 is comprised of a crystal oscillator unit 70, a switch bank controller 72, a temperature unit 74, and a timing controller 76. Unit 70 has a capacitor trimming bank 78, a capacitor switching bank 80, and a piezoelectric crystal (XTAL) 82. Switch bank controller 72 has two parts, a parallel digital latch 84 and a programmable read only memory (PROM) 86. Data in PROM 86 matches the characteristic temperature profile of XTAL 82 and also takes into account the effect of $C_1$–$C_n$ on the frequency output ($f_o$) of XTAL 82. The temperature unit 74 has a temperature sensor 90 and a analog-to-digital converter (ADC) 88. At any particular temperature, a code will be output by ADC 88 to PROM 86 that will apply just the right combination of $C_1$–$C_n$ to bring $f_o$ back to nominal. (At least according to ideal XTAL 82 performance parameters.) Controller 76 has three output signals: 92, 94, and 96. Periodically, controller 76 will cause ADC 88 to begin a new conversion. (Also see FIG. 6 discussion below.) The output of ADC 88 and PROM control signal 94 will cause a particular digital correction word to be output from PROM 86. That word will be output to latch 84 and loaded by signal 92. Latch 84 controls switch bank 80, which in turn can switch in and out various capacitors in capacitor bank 78 in order to trim the resonant frequency of XTAL 82 and keep it stable despite ambient temperature variations. Oscillator 24 is therefore a digitally-corrected temperature-compensated crystal oscillator (DTCXO). Control of the oscillating frequency of the DTCXO is continuous, regardless of whether the radio is active or not.

Prior art DTCXO circuits generate spurious frequency fluctuation noise (FM) and phase fluctuations noise (PM)

whenever the DTCXO circuits vary the temperature correction (for example, by switching on and off capacitors ($C_1$–$C_n$ in capacitor bank 78). As was mentioned above, capacitors $C_1$–$C_n$ are binary-weighted and are combined to produce various correction totals. As an example, capacitors $C_1$–$C_n$ could be weighted as: 1, 2, 4, 8, and 16 picofarads. A range of 0–31 picofarads could then be accommodated in one picofarad steps. The smallest step, one picofarad, results in a certain granularity that will cause oscillator 24 (for example) to display discrete frequency steps when the temperature compensation is hunting. These frequency and phase steps, or fluctuations will consequently be reflected by similar modulating the transmitter and receiver frequencies (which add audible noise to the transmitted and received signals). These spurious modulations can interfere not only with the voice, but data traffic too, and at both ends of the radio communication. If oscillator 54 also shows such fluctuations, the encoder and decoder processes timed by it can experience a loss in signal synchronization, which will necessitate a switch being made to an alternative, "cleaner" channel (when it really wasn't necessary).

Reducing the amount of stepping in a DTCXO frequency control can reduce the impact of any frequency and phase fluctuations generated by the temperature compensation. But the resolution of the temperature measurements and the resolution of the frequency adjustments both would have to be increased, and that would greatly increase the width of the digital control word $D_1$–$D_n$. To support these increases, a higher quality temperature sensor would also be required. Very fine frequency control, such as this, requires very complex circuits and increases the cost of manufacture.

SUMMARY OF THE INVENTION

According to this invention, a radio transceiver having digitally-corrected temperature-compensated crystal oscillators (DTCXOs) comprising digital frequency temperature compensation circuits that are temporarily suspended from being updated, such that temperature compensation updates that can generate noise during periods of reception and transmission that could interfere with the audio channel and/or signal synchronization will be postponed. Temperature is converted to a digital signal that is then used to address a PROM. The PROM outputs a correction word appropriate for the temperature reading and inputs this to a latch. A timing control loads the latch after data has settled. The latched correction word is connected to a bank of switches and capacitors that trim the frequency of the crystal oscillator. During radio transmission and/or reception, the latch will be suspended from loading any new correction words. The last valid correction word, however, will remain.

An advantage of the present invention is that the adverse effects of even large amounts of FM and PM noise that would otherwise occur during transceiver activity are avoided. The accuracy of oscillator frequencies is updated during any times when the transceiver is inactive and carries that accuracy over to active periods.

A further advantage of the present invention is that temperature compensation during active periods of transmission/reception can be suspended in order to control spurious FM and PM modulations that would otherwise appear in the transmitted and received signals.

A further advantage of the present invention is that it has reduced power consumption.

A further advantage of the present invention is that it yields substantially the same benefits as the more complex and expensive configurations of the prior art.

A further advantage of the present invention is that it leads to an improvement in the sensitivity of reception and to the improvement of the stability of the carrier frequency of the transmitter carrier.

A further advantage of the present invention is that integrated circuits may be used to implement it, thus having the consequential advantage of high circuit reliability.

A further advantage of the present invention is that frequency regulation accuracy is maintained at a high level.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

FIG. 3 is similar to FIG. 1 in most details, except that control signal lines appear between the CPU and DTCXOs;

FIG. 4 is similar to FIG. 2 in most details, except that an extra control signal line appears between the latch and timing controller. The timing controller also has an extra SUSPEND input control;

DESCRIPTION OF THE PREFERRED EMBODIMENTS

Figure 1:
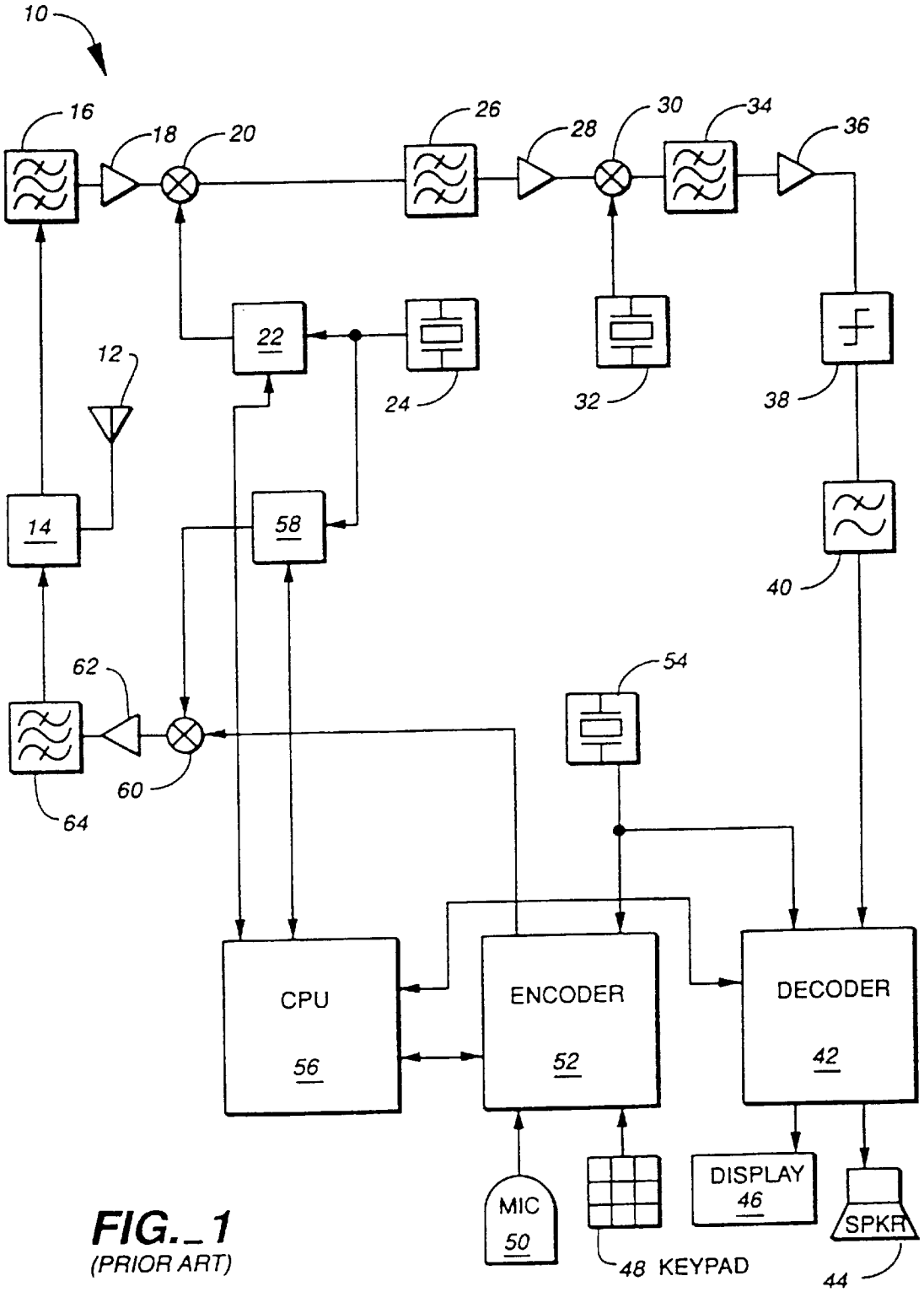
FIG. 1 (PRIOR ART)
FIG. 1 is a block diagram of a prior art cellular telephone transceiver.
Figure 2:
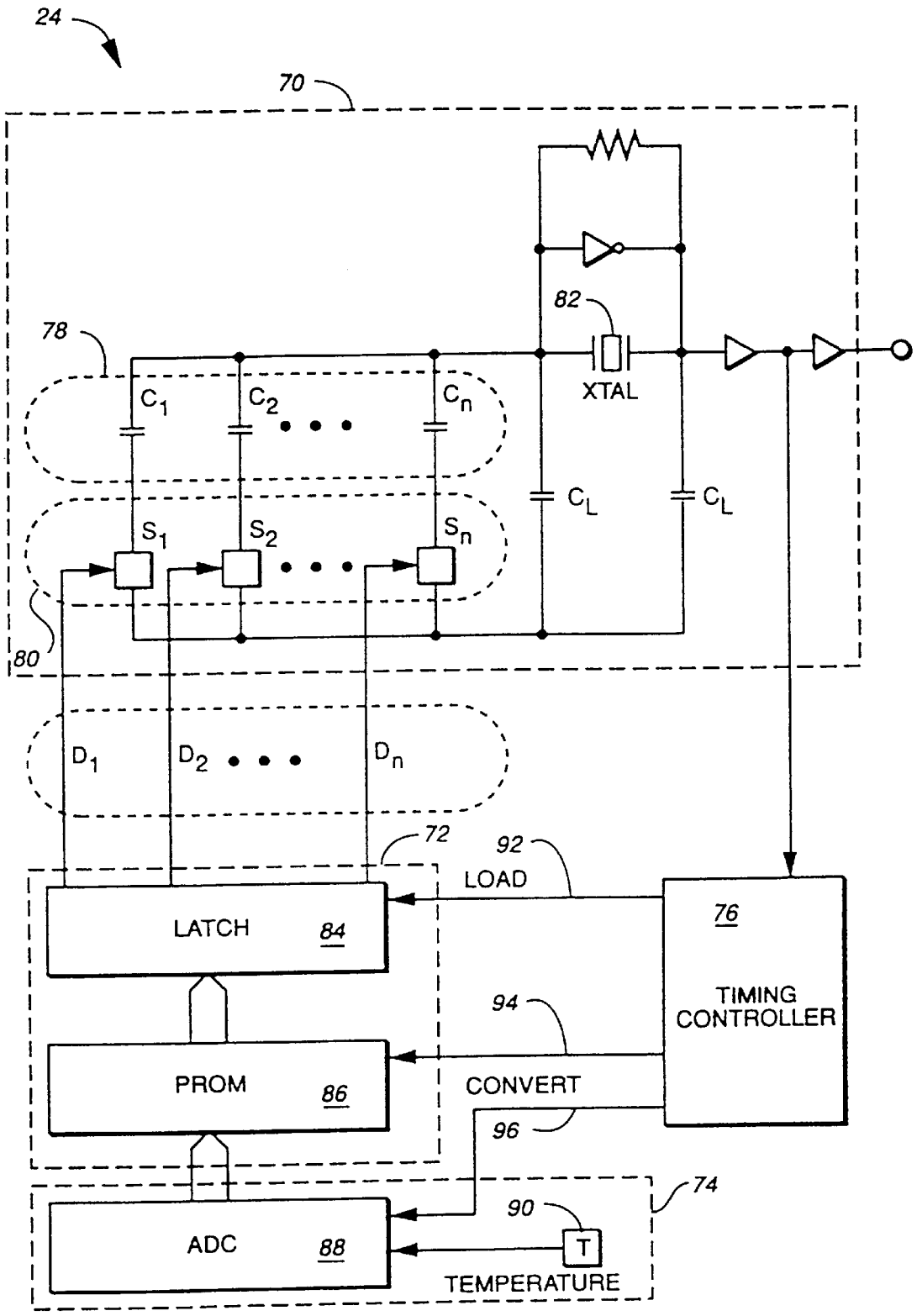
FIG. 2 (PRIOR ART)
FIG. 2 is a schematic diagram of the prior art digitally-corrected temperature-compensated crystal oscillator shown in FIG. 1.
Figure 3:
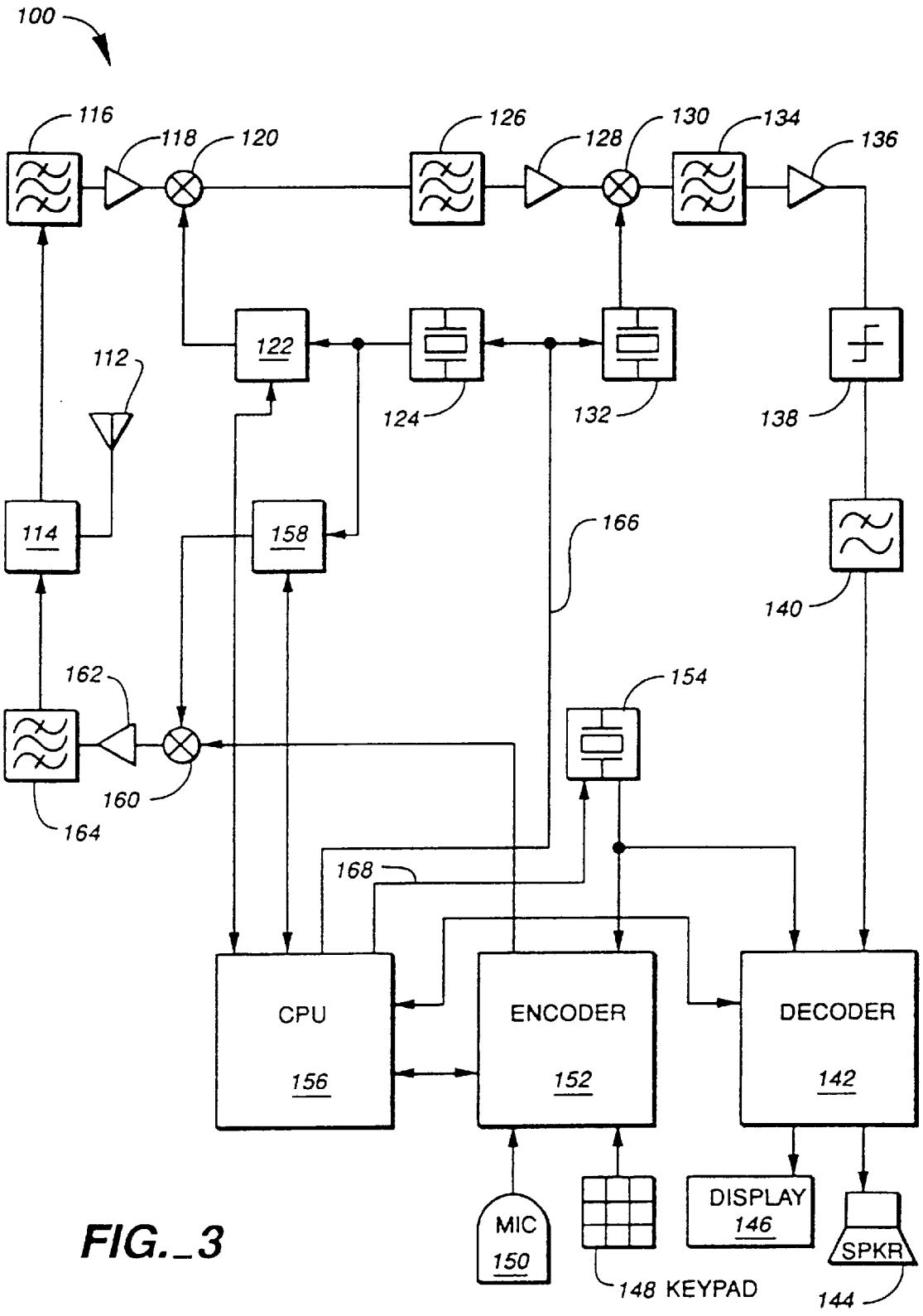
FIG. 3 is a block diagram of a cellular telephone transceiver embodiment of the present invention.

FIG. 3 is a cellular telephone transceiver embodiment of the present invention, referred to by the general reference numeral 100, comprising an antenna 112, a transmit/receive (T/R) transfer switch 114, a bandpass filter 116, an RF amplifier 118, a first mixer 120, a receiver PLL synthesizer 122, a reference oscillator circuit 124, a first intermediate frequency (IF) bandpass filter 126, a first IF amplifier 128, a second mixer 130, a second local oscillator 132, a second IF bandpass 134, a second IF amplifier 136, a detector 138, a low-pass filter 140, a data/voice decoder 142 having a speaker 144 and an alphanumeric display 146, an alphanumeric keypad 148, a microphone 150, a frequency modulation (FM)/pulse modulation (PM) encoder 152, an encoder/decoder oscillator 154, a central processing unit (CPU) 156, a transmitter PLL synthesizer 158, a transmitter mixer 160, a transmitter amplifier 162, and a transmitter bandpass 164. CPU 156 is preferably a microprocessor. An RF receiver is thus formed of elements 112–146, and a matching RF transmitted by elements 148–164, and also sharing 112–114. Receiver PLL synthesizer 122 provides a first local oscillator frequency for the first mixer 120 to beat with the incoming RF frequency to produce a first IF. Receiver PLL synthesizer 122 can be digitally programmed to output various frequencies, and therefore the frequencies received by transceiver 100 can be selectively tuned in. Reference oscillator 124 comprises a first DTCXO and supplies a master reference clock to PLL synthesizers 122 and 158. Because reference oscillator 124 provides the master reference for both transmit and receive, Federal Communications Commission (FCC) rules and good performance demand that the frequency be accurate and have minimal temperature shift. Second local oscillator 132 comprises a second DTCXO, and is similar to oscillator 124 (only the frequencies are different). Alternatively, a divider from reference oscillator 124 is used to provide the second local oscillator frequency (which will normally be a fixed frequency). Demodulator is provided by an FM discriminator, detector 138. The low-pass filter 140 allows only audio frequencies through to decoder 142. Decoder 142 will squelch speaker 144 until a proper calling code identification is received and recognized. Display 146 will keep a user informed of the status of transceiver 100. Voice input is picked up by microphone 150. Outgoing calling codes and operating modes are entered on keypad 148. If appropriate, encoder 152 will output to transmitter mixer 160 to beat with and modulate a transmit carrier frequency coming from PLL synthesizer 158. Just the desired products of transmitter mixer 160 are passed by transmitter bandpass 164. Transceiver 100 is capable of full duplex operation, so transmission will be simultaneous with reception, albeit at different frequencies. Encoder/decoder oscillator 154 supplies a common signal to encoder 152 and decoder 142, and is based on a third DTCXO similar to the first two. CPU 156 controls decoder 142, encoder 152 and the transmit and receive frequencies by virtue of its connects to PLL synthesizers 122 and 158.

The major difference between transceiver 100 and the prior art is CPU 156 can disable the temperature compensation of oscillators 124 and 132 through the connection of a signal line 166 and oscillator 154 through the connection of a signal line 168.

Figure 4:
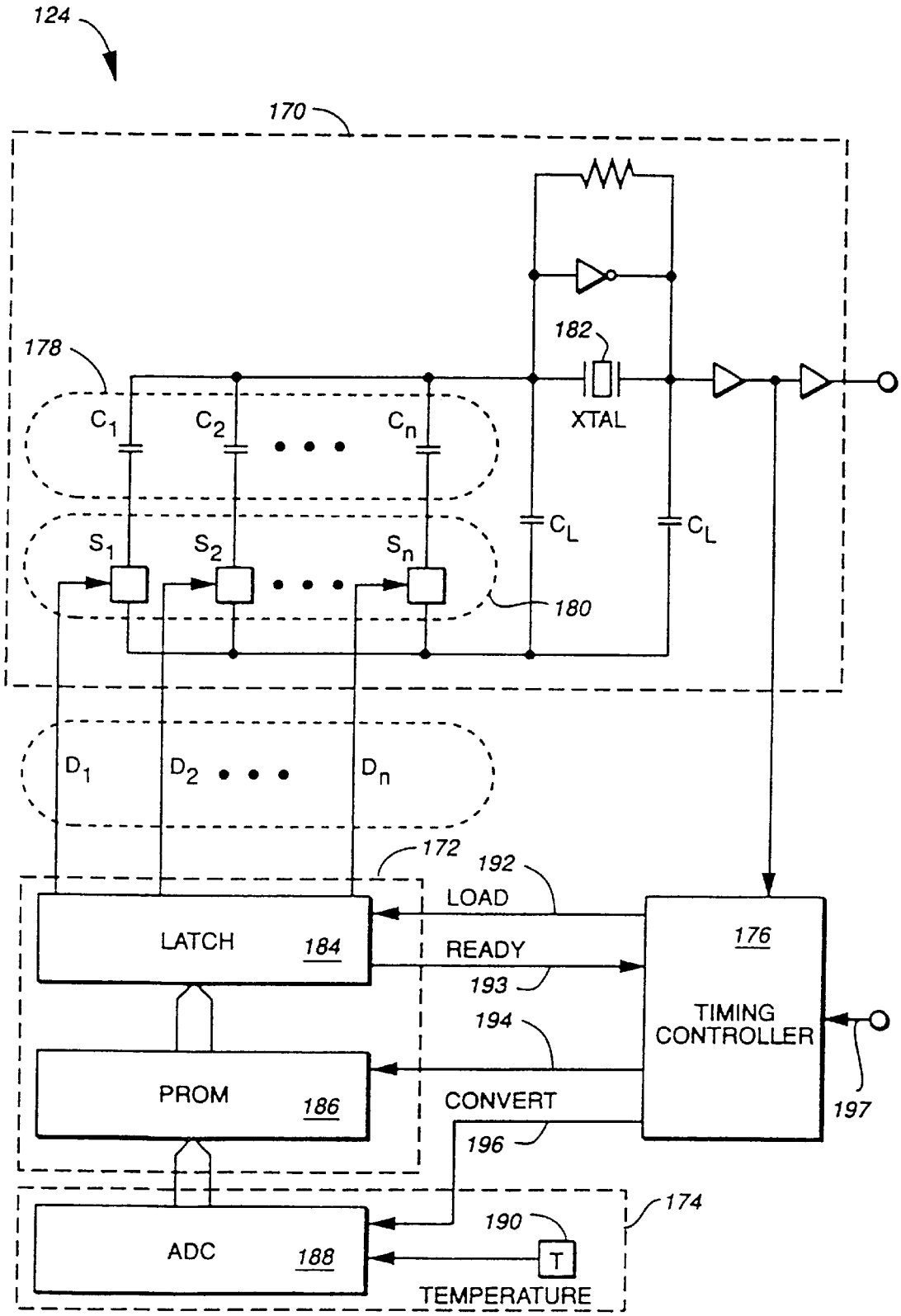
FIG. 4 is a schematic diagram of the digitally-corrected temperature-compensated crystal oscillator shown in FIG. 3.

Although FIG. 4 diagrams oscillator 124, it is also representative of the construction of oscillators 132 and 154. Oscillator 124 is comprised of a crystal oscillator unit 170, a switch bank controller 172, a temperature unit 174, and a timing controller 176. Unit 170 has a capacitor trimming bank 178, a capacitor switching bank 180, and a piezoelectric crystal (XTAL) 182. Switch bank controller 172 has two parts, a parallel digital latch 184 and a programmable read only memory (PROM) 186. The temperature unit 174 has a temperature sensor 190 and a analog-to-digital converter (ADC) 188. Controller 176 has a load signal 192, a ready input signal 193, a PROM control signal 194, a convert-start output signal 196, and a disable input signal 197. Periodically, controller 176 will sample the output frequency of unit 170 and cause ADC 188 to begin a new conversion. The other outputs of controller 176 are phased to provide smooth digital flow from ADC 188, to PROM 186, to Latch 184, and on to switching bank 180. The output of ADC 188 and PROM control signal 194 will cause a particular digital correction word to be output from PROM 186. That word will be output to latch 184 and loaded by signal 192. Latch 184 controls switch bank 180, which in turn can switch in and out various capacitors in capacitor bank 178 in order to trim the resonant frequency of XTAL 182 and to keep it stable despite ambient temperature variations. Oscillator 124 is therefore a digitally-corrected temperature-compensated crystal oscillator (DTCXO) that can have the digital correction slowed or disabled completely.

A characteristic of the present invention is that when latch 184 receives digital frequency correction word from PROM 186, READY signal 193 will be output to timing controller 176. If signal 197 is low, a LOAD signal 192 will cause latch 184 to update. But if signal 197 is high, timing controller 176 will be disabled from issuing LOAD signal 192. Signal 197 therefore functions as a DTCXO temperature compensation update SUSPEND/RESUME.

An alternative embodiment of the present invention includes the use of DTCXOs, such as above, in the local oscillators and signal processing clock circuits of a telephone call pager. In order to reduce the power consumption, the pager will be in standby and periodically turn on its receiver, anywhere from every several milliseconds to every several seconds. During active reception (squelch off). The local oscillator and signal processing circuit clock must be accurate and stable, and noise generated by the temperature compensation must be avoided. For this reason, during reception, any updating of the oscillating frequency control will be suspended. Oscillating frequency control updates will resume after the received signal ceases.

Figures 5A, 5B, 5C, 5D, 5E, 5F, 5G, 5H:
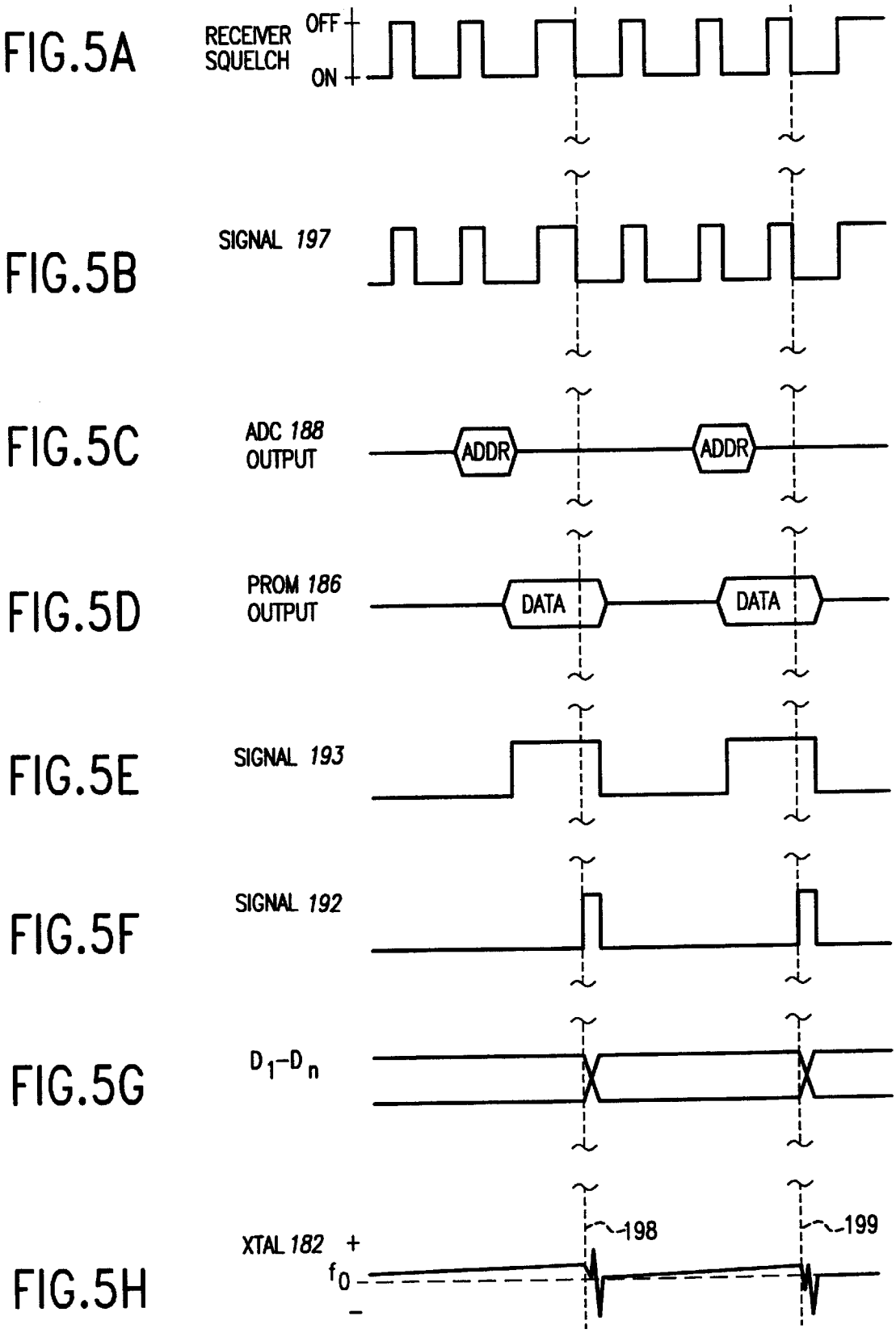
FIG. 5 is a diagram showing the timing relationship between the circuits of FIG. 4.

FIG. 5 shows that when receiver squelch is off (the radio is actively receiving a signal) the control signal 197 will track it and rise to suspend temperature compensation updating. When the receiver squelch is on, control signal 197 is lowered to signal that updates may resume. Resumption occurs at times 198 and 199. Asynchronously with signal 197, ADC 188 will output a digital temperature word. After an access time delay, PROM 186 will output a digital correction word and hold it. Signal 193 rises to indicate the correction word is valid (ready). When signal 197 drops low, and signal 193 is high, then signal 192 will clock high, loading the latch 184 and causing $D_1$–$D_n$ and $S_1$–$S_n$ to change state. These transitions will cause glitches to occur in XTAL 182 $f_o$, thereafter $C_1$–$C_n$ assume a temperature compensating condition that was proper at times 198 and 199.

Figures 6A, 6B, 6C, 6D, 6E, 6F:
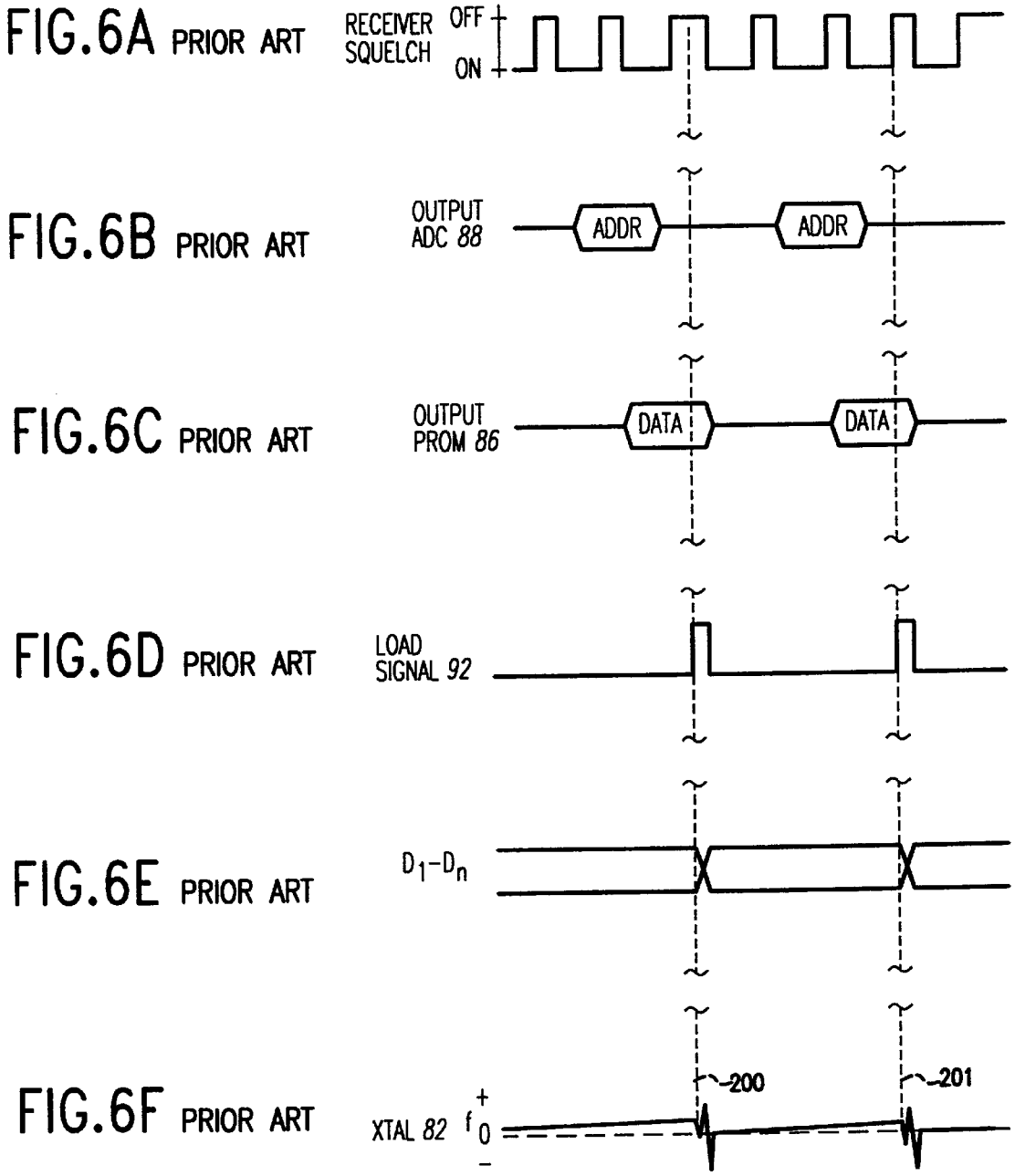
FIG.6A PRIOR ART
FIG.6B PRIOR ART
FIG.6C PRIOR ART
FIG.6D PRIOR ART
FIG.6E PRIOR ART
FIG.6F PRIOR ART
FIG. 6 is a diagram showing the timing relationship between the circuits of FIG. 2. These are presented in contrast to FIG. 5.

FIG. 6 is presented in contrast to FIG. 5. It shows what happens in the prior art when a temperature compensation cycle, at a time 200, occurs randomly and on top of receiver operation. XTAL 82 $f_o$ glitches and interferes with reception and transmission. Another random cycle occurs at a time 201 and again interferes with reception and transmission.

Figures 7A, 7B, 7C, 7D, 7E, 7F, 7G, 7H, 7I:
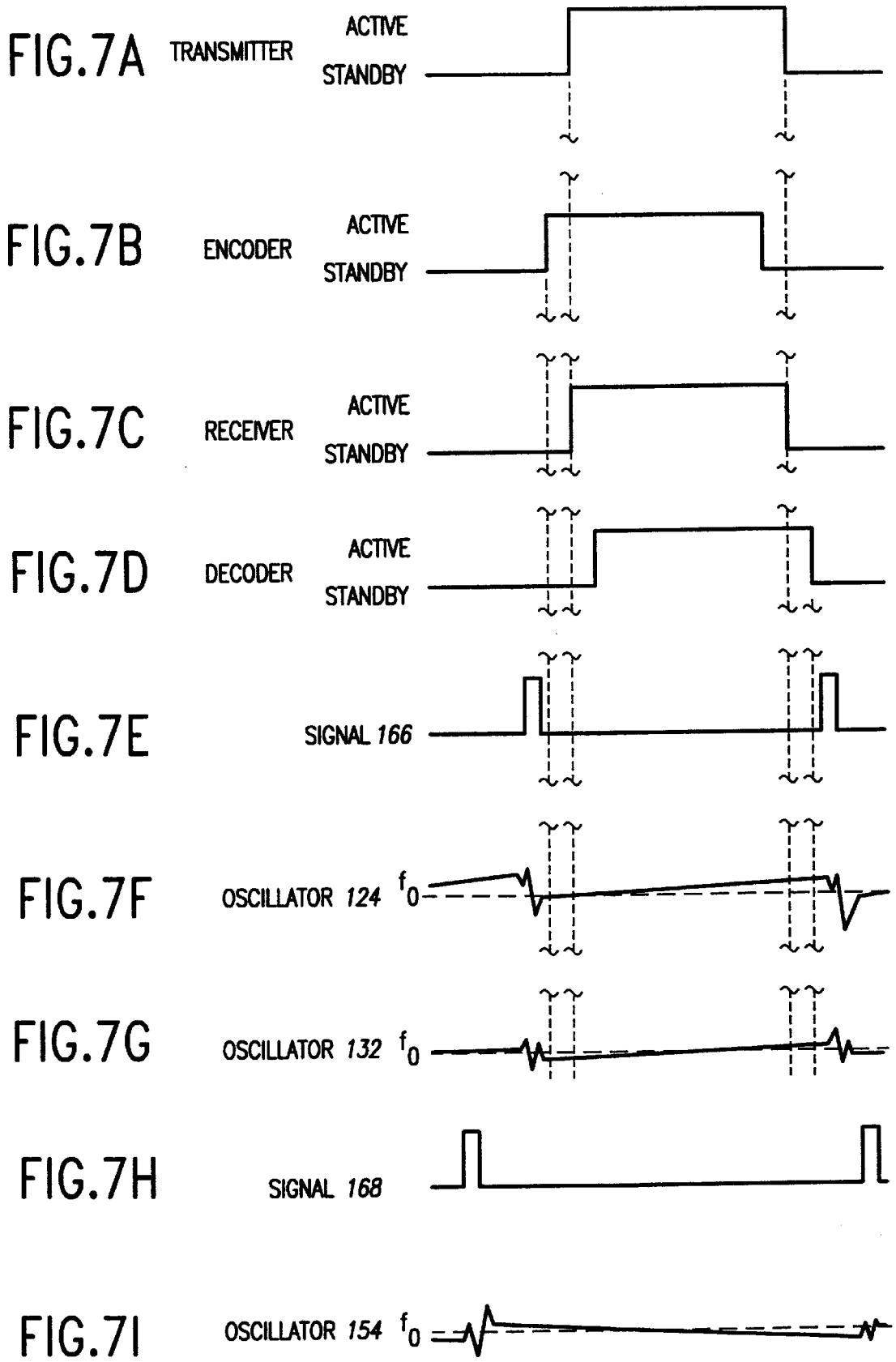
FIG. 7 is a timing diagram showing how transmitter, encoder, receiver, and decoder activity are logically OR'ed together to cause signals 166 and 168 to suspend temperature compensation. The output frequencies of oscillators 124, 132, and 154 are shown drifting without temperature compensation updates during the OR'ed activity.
Figure 8A:
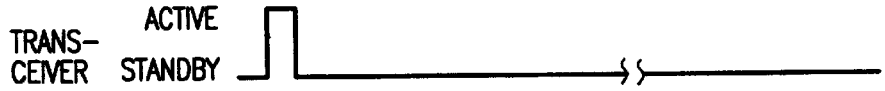
FIG. 8 is a timing diagram showing that a temperature compensation update cycle will be self-initiated and automatically inserted if signal 197 suspends temperature compensation too long.
Figure 8B:
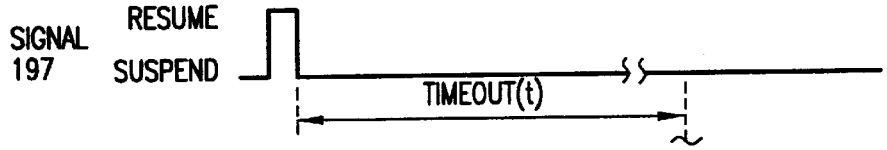
Figure 8C:
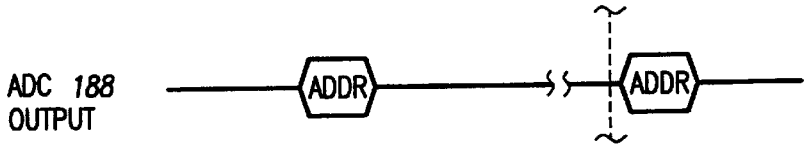
Figure 8D:
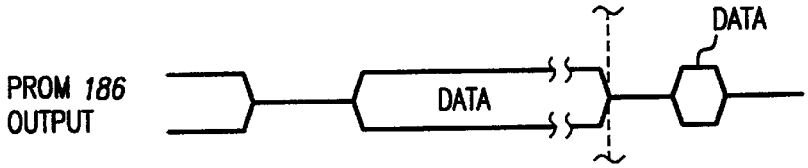
Figure 8E:
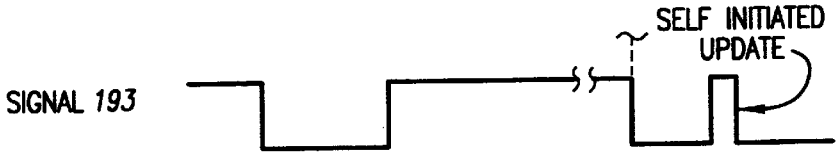
Figure 8F:
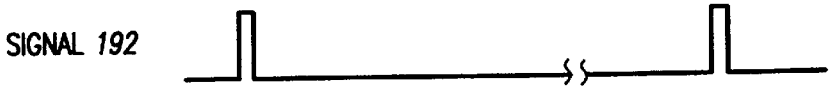
Figure 8G:
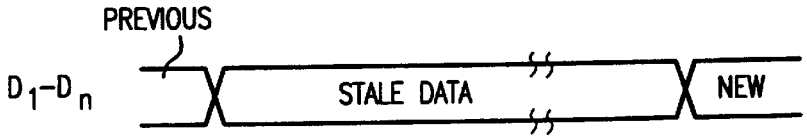
Figure 8H:
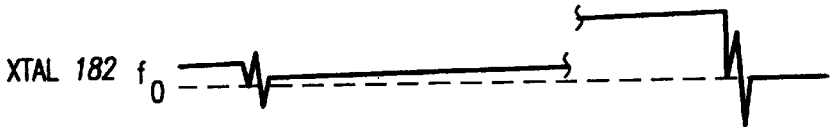
Figure 9A:
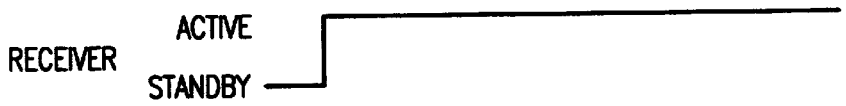
FIG. 9 is a timing diagram showing how the present invention will detect opportunities to update temperature compensation when a transceiver is in the TDMA mode of operation.
Figure 9B:
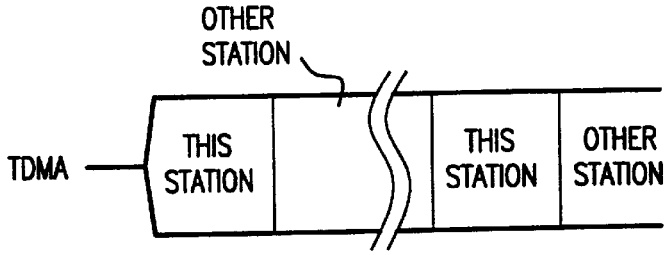
Figure 9C:
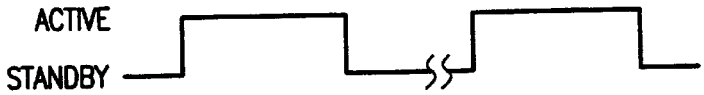
Figure 9D:
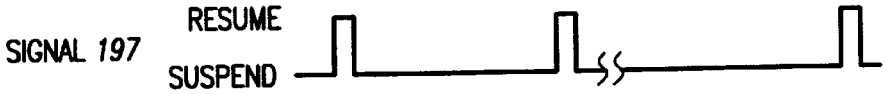
Figure 9E:
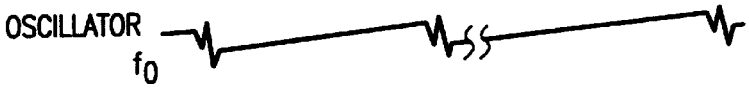
Figure 10A:
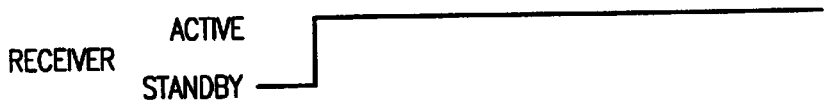
FIG. 10 is a timing diagram showing how the present invention will detect opportunities to update temperature compensation when a transceiver is in the DSI mode of operation.
Figure 10B:
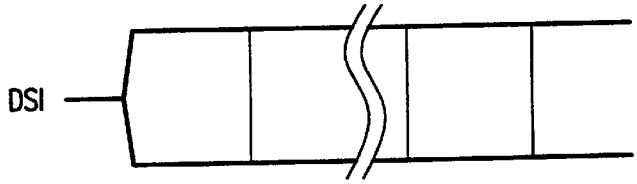
Figure 10C:
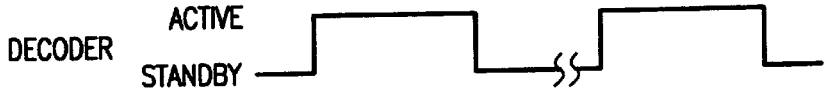
Figure 10D:
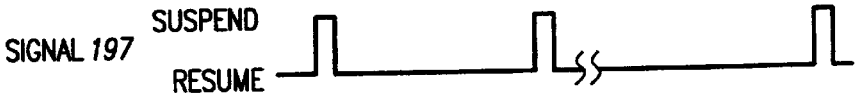
Figure 10E:
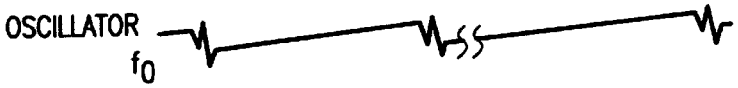

FIG. 7 demonstrates that the first of the transmitter, encoder, receiver, or decoder to become active will cause temperature compensation to be suspended and to hold its last valid correction word until the last of the transmitter, encoder, receiver, or decoder to become inactive. During the temperature compensation suspension, the output frequencies $f_o$ of oscillators 124, 132, and 154 are shown thermally drifting during the period of no temperature compensation updating. Oscillators 124 and 132 are controlled by signal 166, and oscillator 154 is controlled by signal 168. In an alternative embodiment, signal 168 suspends temperature compensation of oscillator 154 only during encoder or decoder activity. Similarly, signal 166 suspends temperature compensation of oscillators 124 and 132 only during transmitter of receiver activity.

FIG. 8 shows what happens if temperature compensation has suspended too long, for any reason. After the last drop of signal 197, a timeout (t) will be initiated that will discard stale data and start a fresh update cycle resulting in signal 192 clocking in a new correction. Thermal drift errors are therefore zeroed periodically.

FIG. 9 is a timing diagram of the time division multiple access (TDMA) mode of operation. TDMA is a time compression communications method that multiplexes several communications devices together within a fixed amount of time. Using this method, a communications device will receive "This Station" data and suspend temperature compensation updates. However, when the data of an "Other Station" is on the channel, temperature compensation will resume. The adverse effects of frequency fluctuation and phase fluctuation can therefore be avoided.

FIG. 10 is a timing diagram of the digital speech interpolation (DSI) mode of operation. DSI is a time compression communications method in which the data of a first speaker is squeezed in during the time period in which a second speaker is not speaking. As with the preceding TDMA method, when this method is receiving required data for "This Station" temperature compensation updates are suspend. When the data of an "Other Station" is on the channel, temperature compensation will resume. Again, the adverse effects of frequency fluctuation and phase fluctuation are avoided.

Wireless communications devices are described above, however, the same advantages and benefits can be realized with hard-wired communications devices as well.

Above, CPU 156 determines when temperature compensation is to be suspended and resumed. Alternatively, such control could be a simple switch on the transmitter key or the receiver squelch and automatic gain control (AGC). Other combinations of operating modes dictating temperature compensation suspension can be defined as the conditions warrant.

Although the present invention has been described in terms of the above embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

[1. A temperature-compensated oscillator, comprising:

means to generate a frequency having an output;

means to adjust said frequency coupled to said frequency generator means;

temperature measurement means, coupled to said frequency adjustment means, in thermal proximity to the frequency generator means;

means to periodically update the frequency adjustment means, coupled to said frequency adjustment means, in response to the temperature measurement means;

means to suspend the periodic update of the frequency adjustment, coupled to said update means, in response to an external control signal; and means to limit to a predetermined timeout the duration in time the suspension means can suspend said periodic update coupled to said means to suspend.]

[2. The oscillator of claim 1, wherein:

the frequency generation means comprises a piezoelectric crystal oscillator having a bank of trimming capacitors controlled by switches such that a digital code presented to said switches will cause said crystal oscillator to vary in output frequency.]

[3. The oscillator of claim 1, wherein:

the temperature detecting means comprises an ambient temperature sensor and a analog-to-digital converter connected to the frequency adjusting means.]

[4. The oscillator of claim 1, wherein:

the frequency adjusting means comprises a programmable read only memory responsive to the temperature detecting means and a latch connected to the frequency generating means.]

[5. A digitally-corrected temperature compensated crystal oscillator (DTCXO) having an output and a control input, comprising:

means for generating a free-running frequency signal connected to the output, comprising a piezoelectric crystal oscillator having a bank of trimming capacitors controlled by switches such that a digital code presented to said switches will cause said DTCXO to vary in output frequency;

means for detecting an ambient temperature proximate to the frequency generating means, comprising an ambient temperature sensor and a analog-to-digital converter;

means for adjusting said free-running frequency signal responsive to the detection means and connected to the frequency generating means, comprising a programmable read only memory responsive to the temperature detecting means and a latch connected to the frequency generating means; and means to suspend the adjusting means such that a last valid adjustment value is held during a period of suspension, the suspension means responsive to the control input and connected to the frequency adjusting means.]

[6. The DTCXO of claim 5, further comprising:

means to periodically disable the suspension means upon the occurrence and reoccurrence of a predetermined timeout responsive to the suspension means and a timer.]

[7. A radio communications unit, comprising:

at least one digitally-corrected temperature-compensated crystal oscillator (DTCXO) having an output and a control input, having:

(a) means for generating a free-running frequency signal connected to the output, comprising a piezoelectric crystal oscillator having a bank of trimming capacitors controlled by switches such that a digital code presented to said switches will cause said DTCXO to vary in output frequency;

(b) means for detecting an ambient temperature proximate to the frequency generating means, comprising an ambient temperature sensor and a analog-to-digital converter;

(c) means for adjusting said free-running frequency signal responsive to the detection means and connected to the frequency generating means, comprising a programmable read only memory responsive to the temperature detecting means and a latch connected to the frequency generating means; and (d) means to suspend the adjusting means such that a last valid adjustment value is held during a period of suspension, the suspension means responsive to the control input and connected to the frequency adjusting means.

means for receiving communications responsive to a signal from the DTCXO.]

[8. The unit of claim 7, further comprising:

means for transmitting communications responsive to a signal from the DTCXO.]

[9. The unit of claim 7, further comprising:

a microprocessor connected such that said DTCXO control input is manipulated in response to a plurality of operating modes existing in the radio communications unit.]

[10. A method for improving the quality of electronic telecommunications in a multi-mode communication means utilizing an oscillator having a temperature compensation means to update a value based upon detected temperature at said oscillator and, via adjustment means, change the frequency of oscillation of said oscillator to a predetermined frequency of oscillation based upon said updated value, comprising the steps of:

detecting which, if any, modes of electronic telecommunication are active;

suspending the updating by said temperature compensation means upon detection of an active mode to prevent said updating from generating interference that can degrade the operation of the active mode of said communications means;

providing a delay period commencing from the point in time when updating last occurred; and updating said temperature compensation means value after the expiration of the delay period whether or not an active mode is detected.]

[11. The method of claim 10, wherein:

said modes comprise transmission, message encoding, reception, and message decoding.]

[12. A method for improving the quality of communications in a cellular telephone having modes comprising transmission, message encoding, reception, and message decoding, the telephone utilizing an oscillator having a temperature compensation means to update a value based upon detected temperature at said oscillator and, via adjustment means, change the frequency of oscillation of said oscillator to a predetermined frequency of oscillation based upon said updated value, comprising the steps of:

detecting which, if any, modes of electronic telecommunication are active;

suspending the updating by said temperature compensation means upon detection of an active mode to prevent said updating from generating interference that can degrade the operation of the active mode of said cellular telephone;

providing a delay period commencing from the point in time when updating last occurred; and updating said temperature compensation means value after the expiration of the delay period whether or not an active mode is detected.]

[13. A computer-implemented process for improving electronic communications in a radio having a microprocessor, comprising the following steps:

detecting whether or not at least one mode of electronic communication is active, said modes comprising transmission, message encoding, reception, and message decoding;

suspending an updating of a temperature compensation correction word in an oscillator system providing reference frequencies that are supporting said electronic communications, such that interference and errors otherwise generated by said updating of said temperature compensation correction word will not be induced during the time activity of said mode is detected; and waiting a timeout period from a point of last inactivity of said mode and then forcing the updating of said temperature compensation correction word in said oscillator system.]

[14. A method for improving receiver sensitivity and for reducing power consumption in a telephone pager utilizing an oscillator having a temperature compensation means to update a value based upon detected temperature at said oscillator and, via adjustment means, change the frequency of oscillation of said oscillator to a predetermined frequency of oscillation based upon said updated value, comprising the steps of:

detecting when the pager is in a standby mode of operation;

suspending the updating by said temperature compensation means upon detection of said standby mode to prevent said temperature compensation updating means from generating interference that can deteriorate the receiver sensitivity of the pager and from consuming power;

providing a delay period commencing from the point in time when updating last occurred; and updating said temperature compensation means value after the expiration of the delay period whether or not an active mode is detected.]

*15. A digitally-corrected, temperature-compensated crystal oscillator circuit having an output terminal and a control input terminal inputting an external control signal indicating a state of a communication circuit, said digitally-corrected, temperature-compensated crystal oscillator circuit, comprising:*

*an oscillator circuit generating a frequency signal, the frequency signal output on the output terminal;*

*a compensation circuit connected to the oscillator, wherein a frequency of the frequency signal is based on a state of the compensation circuit;*

*a temperature sensor circuit detecting an ambient temperature and outputting a temperature signal based on the detected ambient temperature;*

*a conversion circuit connected to the temperature sensor circuit and the compensation circuit and inputting the temperature signal and outputting a ready signal and a compensation signal, the state of the compensation circuit based on the compensation signal; and*

*a control circuit connected to the conversion circuit and inputting the external control signal and outputting a control signal to the conversion circuit only when the external control signal indicates that the communication circuit is not active and the ready signal is generated by the conversion circuit, the conversion circuit updating the compensation signal based on the control signal.*

*16. The digitally-corrected, temperature-compensated crystal oscillator circuit of claim 15, wherein the temperature sensor is in thermal proximity to the oscillator circuit.*

*17. The digitally-corrected, temperature-compensated crystal oscillator circuit of claim 15, wherein the control circuit comprises a timer circuit, wherein, when the timer*

*circuit times out, the control circuit operates the conversion circuit to update the compensation signal independently of the sate of the external control signal.*

*18. The digitally-corrected, temperature-compensated crystal oscillator circuit of claim 15, wherein the conversion circuit comprises:*

*a memory device storing a temperature conversion table, wherein the memory device inputs the temperature signal as an address and outputs the compensation signal; and*

*a latch circuit for latching the compensation signal based on the control signal output by the control circuit.*

*19. The digitally-corrected, temperature-compensated crystal oscillator circuit of claim 15, wherein the temperature sensor circuit comprises:*

*a temperature sensing device outputting an analog temperature signal; and*

*an analog-to-digital converter inputting the analog temperature signal and outputting a digital temperature signal as the temperature signal to the conversion circuit.*

*20. The digitally-corrected, temperature-compensated crystal oscillator circuit of claim 15, wherein the compensation circuit comprises:*

*a switching circuit, comprising a plurality of switches, and inputting the compensation signal, a state of each switch based on the compensation signal; and*

*a capacitor trimming circuit comprising a plurality of capacitors, each capacitor connected to a corresponding one of the plurality of switches of the switching circuit, each one of the plurality of capacitors switched in and out of the capacitor trimming circuit based on the state of the corresponding switch, wherein a total effective capacitance of the capacitor trimming circuit is based on which capacitors are switched in, the total effective capacitance adjusting the frequency of the signal output by the oscillator circuit.*

*21. The digitally-corrected, temperature-compensated crystal oscillator circuit of claim 15, wherein the compensation circuit comprises at least one varactor, a state of each at least one varactor based on the compensation signal.*

*22. The digitally-corrected, temperature-compensated crystal oscillator circuit of claim 15, wherein the oscillator circuit comprises a piezoelectric crystal oscillator.*

*23. A communication unit, comprising:*

*an oscillator circuit outputting a pulse signal;*

*a temperature sensor circuit outputting a temperature signal indicative of a sensed temperature;*

*a temperature conversion circuit outputting a ready signal and a temperature compensation signal based on the temperature signal;*

*a temperature compensation circuit, wherein a state of the temperature compensation circuit is based on the temperature compensation signal, the state of the temperature compensation circuit adjusting a frequency of the pulse signal output by the oscillator circuit; and*

*a communication circuit inputting the pulse signal, wherein based on an operating state of the communication circuit and generation of the ready signal by the temperature conversion circuit, an update of the adjustment of the frequency of the pulse signal by the temperature compensation circuit is suspended.*

*24. The communications unit of claim 23, wherein the temperature sensor circuit is in thermal proximity to the oscillator circuit.*

*25. The communication unit of claim 23, further comprising a control circuit inputting an external control signal indicative of the operating state of the communication circuit and outputting a control signal, based on the state of the external control signal, to the temperature conversion circuit to cause the temperature conversion circuit to output the temperature compensation signal, the control circuit including a timer circuit, wherein, when the timer circuit times out, the control circuit outputs the control signal to the temperature conversion circuit independently of the state of the external control signal.*

*26. The communications unit of claim 23, wherein the temperature conversion circuit comprises:*

*a memory device storing a temperature conversion table, wherein the memory device inputs the temperature signal as an address and outputs the temperature compensation signal; and a latch circuit for latching the temperature compensation signal based on the control signal output by the control circuit.*

*27. The communications unit of claim 26, wherein the temperature compensation circuit further comprises:*

*a switching circuit, comprising a plurality of switches, and inputting the temperature compensation signal, a state of each switch based on the temperature compensation signal; and*

*a capacitor trimming circuit comprising a plurality of capacitors, each capacitor connected to a corresponding one of the plurality of switches of the switching circuit, each one of the plurality of capacitors switched in and out of the capacitor trimming circuit based on the state of the corresponding switch, wherein a total effective capacitance of the capacitor trimming circuit is based on which capacitors are switched in, the total effective capacitance adjusting the frequency of the pulse signal output by the oscillator circuit.*

*28. The communications unit of claim 26, wherein the temperature compensation circuit further comprises at least one varactor, a state of each at least one varactor based on the temperature compensation signal.*

*29. The communications unit of claim 23, wherein the temperature sensor circuit comprises:*

*a temperature sensing device outputting an analog temperature signal; and*

*an analog-to-digital converter inputting the analog temperature signal and outputting a digital temperature signal as the temperature signal to the temperature conversion circuit.*

*30. The communication unit of claim 23, wherein the oscillator circuit comprises a piezoelectric crystal oscillator.*

*31. The communications unit of claim 23, wherein the communications circuit comprises at least one of a receiving circuit and a transmitting circuit.*

*32. The communication unit of claim 23, wherein the temperature compensation circuit periodically adjusts the frequency of the pulse signal output by the oscillator circuit.*

*33. The communication unit of claim 23, wherein the communication circuit is a radio communication circuit.*

*34. The communication unit of claim 23, wherein the communication circuit is a wire communication circuit.*

*35. A communications unit, comprising:*

*an oscillator circuit outputting pulse signal;*

*a communications circuit inputting the pulse signal of the oscillator circuit, wherein the communications circuit alternates, periodically, between a receive state and a standby state, the communications circuit outputting an external control signal based on the state of the communications circuit;*

*a temperature sensor circuit outputting a temperature signal indicative of a sensed temperature;*

*a temperature conversion circuit inputting the temperature signal and outputting a ready signal and a temperature compensation signal based on the temperature signal;*

*a temperature compensation circuit, wherein a state of the temperature compensation circuit is based on the temperature compensation signal, the state of the temperature compensation circuit adjusting a frequency of the pulse signal output by the oscillator circuit; and*

*a control circuit inputting the external control signal and outputting a control signal to the temperature conversion circuit to operate the temperature conversion circuit to update the state of the temperature compensation circuit only when the communications circuit is in the standby state and the ready signal is generated by the temperature conversion circuit, wherein the control circuit is prevented from outputting the control signal to the temperature conversion circuit when the external control signal indicates that the communications circuit is in the receive state.*

*36. A time division multiple access communications unit, comprising:*

*an oscillator circuit outputting a pulse signal;*

*a time division multiple access communications circuit inputting the pulse signal of the oscillator circuit, wherein the communications circuit has receive operation periods, send operation periods, and idle periods, the communications circuit outputting an external control signal;*

*a temperature sensor circuit outputting a temperature signal indicative of a sensed temperature;*

*a temperature conversion circuit outputting a ready signal and a temperature compensation signal based on the temperature signal;*

*a temperature compensation circuit, wherein a state of the temperature compensation circuit is based on the temperature compensation signal, the state of the temperature compensation circuit adjusting a frequency of the pulse signal output by the oscillator circuit; and*

*a control circuit inputting the external control signal and outputting a control signal to the temperature conversion circuit to operate the temperature conversion circuit to update the state of the temperature compensation circuit only when the communications circuit is in said idle periods and the ready signal is generated by the temperature conversion circuit, wherein the control circuit is prevented from outputting the control signal to the temperature conversion circuit when the external control signal indicates that the communications circuit is in one of a receive operation period or a send operation period.*

*37. A compensated oscillator, comprising:*

*an oscillator circuit outputting a pulse signal;*

*a compensation signal generating circuit outputting a compensation signal and a ready signal;*

*a compensation circuit, wherein a state of the compensation circuit is based on the compensation signal, the state of the compensation circuit adjusting a frequency of the pulse signal output by the oscillator circuit; and*

*a control circuit inputting an external control signal and outputting a control signal to the compensation signal generating circuit to operate the compensation signal generating circuit to output the compensation signal to update the state of the compensation circuit, wherein, the control circuit is prevented from outputting the control signal when the external control signal indicates that a communication circuit that uses said pulse signal is active and the ready signal is not generated by the compensation signal generating circuit.*

*38. A communication unit, comprising:*

*an oscillator circuit outputting a pulse signal;*

*a compensation signal generating circuit outputting a compensation signal and a ready signal;*

*a compensation circuit, wherein a state of the compensation circuit is based on the compensation signal, the state of the compensation circuit adjusting a frequency of the pulse signal output by the oscillator circuit; and*

*a communication circuit inputting the pulse signal, wherein, based on an operating state of the communication circuit and generation of the ready signal by the compensation signal generating circuit, an update of the adjustment of the frequency is suspended.*

* * * * *